US012757487B2

(12) United States Patent
Wu et al.

(10) Patent No.: US 12,757,487 B2
(45) Date of Patent: Oct. 6, 2026

(54) ELECTRONIC DEVICE AND MANUFACTURING METHOD OF ELECTRONIC DEVICE

(71) Applicant: Innolux Corporation, Miaoli County (TW)

(72) Inventors: Shu-Ling Wu, Miaoli County (TW); Chia-Ping Tseng, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 692 days.

(21) Appl. No.: 18/186,965

(22) Filed: Mar. 21, 2023

(65) Prior Publication Data

US 2023/0352595 A1 Nov. 2, 2023

Related U.S. Application Data

(60) Provisional application No. 63/335,227, filed on Apr. 27, 2022.

(30) Foreign Application Priority Data

Jan. 6, 2023 (CN) ........................ 202310020137.2

(51) Int. Cl.

*H10D 86/01* (2026.01)
*H10D 86/40* (2025.01)
*H10W 72/00* (2026.01)
*H10W 90/00* (2026.01)

(52) U.S. Cl.

CPC ....... *H10D 86/451* (2025.01); *H10D 86/0231* (2025.01); *H10W 72/019* (2026.01); *H10W 90/00* (2026.01)

(58) Field of Classification Search

CPC ..... H10D 86/0231; H01L 24/03; H01L 25/50; H01L 25/167

See application file for complete search history.

(56) References Cited

U.S. PATENT DOCUMENTS

| | | | | |
|---|---|---|---|---|
| 6,645,852 | B1 * | 11/2003 | Taguchi | H01L 21/76807 438/637 |
| 6,985,193 | B2 | 1/2006 | Jang | |
| 2010/0319974 | A1 * | 12/2010 | Ishizuka | H05K 1/0271 174/260 |
| 2017/0062392 | A1 * | 3/2017 | Cheng | H01L 25/50 |
| 2018/0341143 | A1 | 11/2018 | Hyodo et al. | |
| 2020/0343179 | A1 * | 10/2020 | Kuo | H01L 23/5226 |
| 2021/0143304 | A1 | 5/2021 | Tai et al. | |

FOREIGN PATENT DOCUMENTS

TW 201834154 9/2018

OTHER PUBLICATIONS

"Office Action of Taiwan Counterpart Application", issued on Jul. 25, 2025, p. 1-p. 4.

* cited by examiner

*Primary Examiner* — Peter M Albrecht
(74) *Attorney, Agent, or Firm* — JCIPRNET

(57) ABSTRACT

A manufacturing method of an electronic device is provided, which includes following steps. A substrate is provided. A conductive layer is formed on the substrate. A circuit structure is formed on the conductive layer. The circuit structure is patterned to form at least one opening. The at least one opening has a stepped profile. An electronic device is also provided.

8 Claims, 13 Drawing Sheets

ELECTRONIC DEVICE AND MANUFACTURING METHOD OF ELECTRONIC DEVICE

CROSS-REFERENCE TO RELATED APPLICATION

This application claims the priority benefits of U.S. provisional application Ser. No. 63/335,227, filed on Apr. 27, 2022 and China application serial no. 202310020137.2, filed on Jan. 6, 2023. The entirety of each of the above-mentioned patent applications is hereby incorporated by reference herein and made a part of this specification.

BACKGROUND

Technical Field

The disclosure relates to an electronic device and a manufacturing method of the electronic device, and more particularly, to an antenna device and a manufacturing method of the antenna device.

Description of Related Art

In an electronic device, a conductive layer used as a pad portion is provided and used, for example, in a bonding process of a back-end of line (BEOL) process. However, there will be multiple insulating layers between the conductive layer and an external electronic component (such as a chip), and these insulating layers do not include the same material. Therefore, when an etching process is performed on these insulating layers to form through holes for electrically connecting the conductive layer with the external electronic component, it is easy to increase the possibility of defects generated in the through holes due to a relatively large thickness and different material properties of these insulating layers, so that the reliability of the electronic device is reduced.

SUMMARY

The disclosure provides an electronic device and a manufacturing method of the electronic device, which may reduce the possibility of defects generated in through holes formed in the electronic device, so that reliability of the electronic device of the disclosure is improved.

According to some embodiments of the disclosure, a manufacturing method of an electronic device includes following steps. A substrate is provided. A conductive layer is formed on the substrate. A circuit structure is formed on the conductive layer. The circuit structure is patterned to form at least one opening. The at least one opening has a stepped profile.

According to some embodiments of the disclosure, an electronic device includes a substrate, a conductive layer, a circuit structure, a bonding pad, and a chip. The conductive layer is disposed on the substrate. The circuit structure is disposed on the conductive layer and includes at least one opening. The bonding pad is disposed in the at least one opening. The chip is disposed on the bonding pad and electrically connected to the conductive layer. The at least one opening has a stepped profile.

In order for the aforementioned features and advantages of the disclosure to be more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
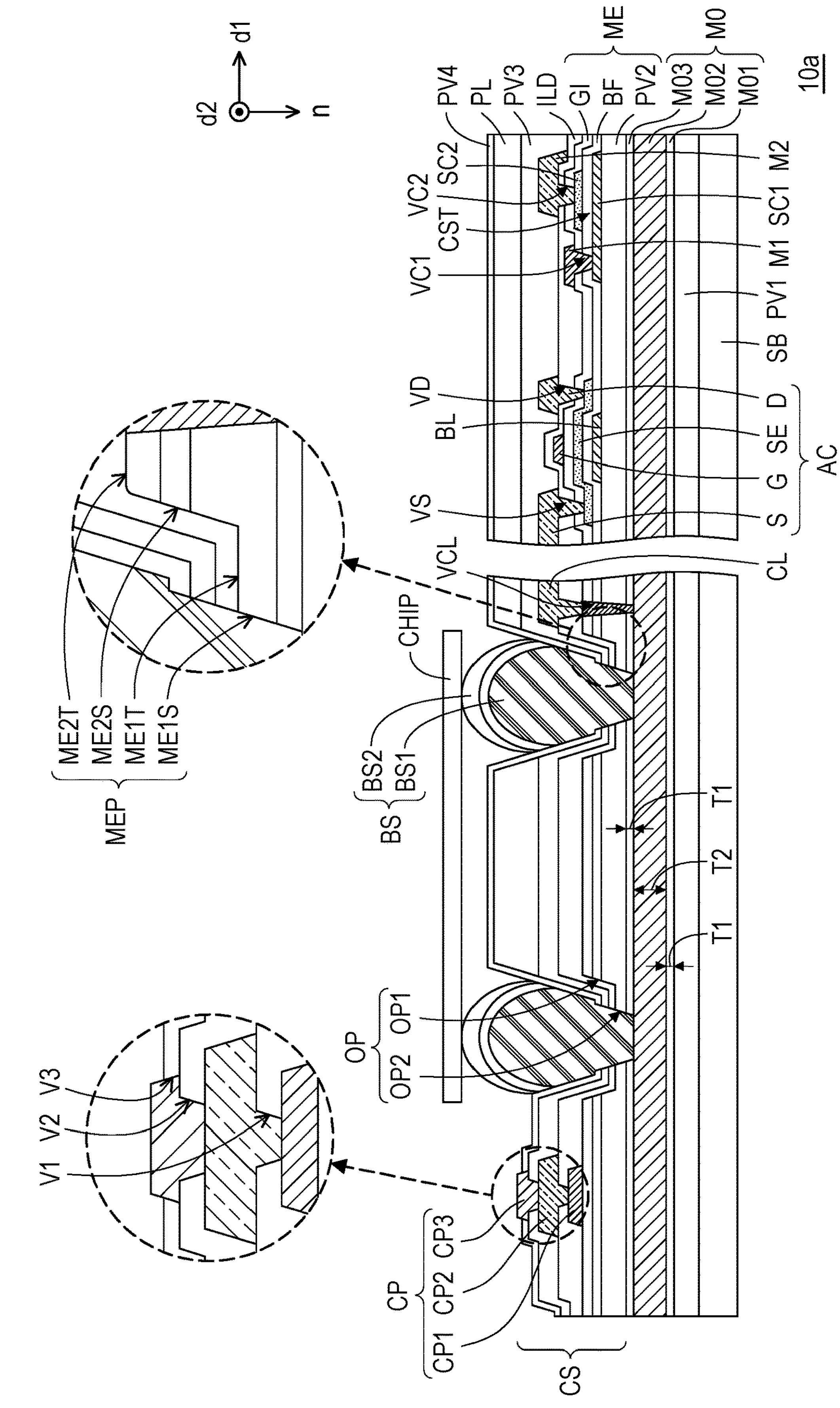
FIG. 1 is a schematic partial cross-sectional view of an electronic device according to a first embodiment of the disclosure.

The disclosure may be understood by referring to the following detailed description in conjunction with the accompanying drawings. It should be noted that, in order to achieve easy understanding of the readers and concise of the drawings, the drawings in the disclosure only depict a part of an electronic device, and specific elements in the drawings are not drawn to actual scales. In addition, the number and size of each element in the figures are for illustration only, and are not intended to limit the scope of the disclosure.

Certain terms are used throughout the specification of the disclosure and the appended claims to refer to specific components. Those skilled in the art should understand that electronic device manufacturers may probably use different names to refer to the same components. This specification is not intended to distinguish between components that have the same function but different names. In the following specification and claims, the terms "including", "containing", "having", etc., are open terms, so that they should be interpreted as meaning of "including but not limited to . . . ". Therefore, when the terms "including", "containing", and/or "having" are used in the description of the disclosure, they specify existence of corresponding features, regions, steps, operations, and/or components, but do not exclude existence of one or more corresponding features, regions, steps, operations, and/or components.

Directional terminology mentioned in the specification, such as "top", "bottom", "front", "back", "left", "right", etc., is used with reference to the orientation of the figures being described. Therefore, the used directional terminology is only illustrative, and is not intended to be limiting of the disclosure. In the figures, the drawings illustrate general characteristics of methods, structures, and/or materials used in specific embodiments. However, these drawings should not be construed as defining or limiting of a scope or nature covered by these embodiments. For example, for clarity's sake, a relative size, a thickness and a location of each film layer, area and/or structure may be reduced or enlarged.

When a corresponding component, for example, a film layer or an area referred to be "on another component", the component may be directly located on the another component, or other components probably exist there between. On the other hand, when a component is referred to be "directly on another component", none other component exits there between. Moreover, when a component is referred to be "on another component", the two components have an up-down relationship in a top view, and this component may be above or below the another component, and the up-down relationship depends on an orientation of the device.

The terms "about", "equal to", "equivalent" or "identical", "substantially" or "approximately" are generally interpreted as being within a range of 10% of a given value or range, or as being within a range of 10%, 5%, 3%, 2%, 1%, or 0.5% of the given value or range.

The ordinal numbers used in the specification and claims, such as "first", "second", etc., are used to modify components, and do not imply and represent the component or these components have any previous ordinal numbers, and do not represent a sequence of one component with another, or a sequence in a manufacturing method. The use of these ordinal numbers is only to make a clear distinction between a component with a certain name and another component with the same name. The same terms may not be used in the claims and the specification, and accordingly, a first component in the specification may be a second component in the claims.

It should be noted that, in the following embodiments, the features of several different embodiments may be replaced, reorganized, and mixed to complete other embodiments without departing from the spirit of the disclosure. As long as the features of the various embodiments do not violate the spirit of the disclosure or conflict with each other, they may be mixed and matched arbitrarily.

The electrical connection or coupling described in this disclosure may refer to direct connection or indirect connection. In the case of direct connection, terminals of components on two circuits are directly connected or connected to each other by a conductor line segment, and in the case of indirect connection, there are switches, diodes, capacitors, inductors, resistors, other suitable components, or a combination of the above components between the terminals of the components on the two circuits, but the disclosure is not limited thereto.

In the disclosure, a thickness, length, width, and area may be measured by using an optical microscope, and the thickness may be obtained by measuring a cross-sectional image in the electron microscope, but the disclosure is not limited thereto. In addition, there may be a certain error in any two values or directions used for comparison. If a first value is equal to a second value, it implies that there may be an error of about 10% between the first value and the second value; If a first direction is perpendicular to a second direction, an angle between the first direction and the second direction may be between 80 degrees and 100 degrees; and if the first direction is parallel to the second direction, the angle between the first direction and the second direction may be between 0 degree and 10 degrees.

The electronic device of the disclosure may include an antenna device, a display device, a sensing device, a light emitting device, or a splicing device, and a packaging device, but the disclosure is not limited thereto. The electronic device may include a bendable or flexible electronic device. The electronic device may include electronic components. The electronic device includes, for example, a liquid crystal layer or a light emitting diode (LED). The electronic components may include passive components and active components, such as capacitors, resistors, inductors, variable capacitors, filters, diodes, transistors, sensors, MEMS elements, liquid crystal chips, etc., but the disclosure is not limited hereto. The diodes may include light emitting diodes or photodiodes. The light emitting diodes may include, for example, organic light emitting diodes (OLEDs), mini LEDs, micro LEDs, quantum dot LEDs, fluorescence, phosphor or other suitable materials, or a combination of the above, but the disclosure is not limited thereto. The sensors may, for example, include capacitive sensors, optical sensors, electromagnetic sensors, fingerprint sensors (FPSs), touch sensors, antennas, or pen sensors, etc., but the disclosure is not limited thereto.

Exemplary embodiments of the disclosure are introduced below, where an electronic device implemented as an antenna device is taken as an example for description, and the same reference numerals are used in the drawings and descriptions to denote the same or similar parts.

FIG. 1 is a schematic partial cross-sectional view of an electronic device according to a first embodiment of the disclosure.

Referring to FIG. 1, an electronic device 10*a* of the embodiment includes a substrate SB, a conductive layer M0, a circuit structure CS, a bonding pad BS, and a chip CHIP. It should be noted that the electronic device 10*a* of the embodiment may include, for example, an antenna device, a display device, a sensing device, a light emitting device or a splicing device, but the disclosure is not limited thereto. In the embodiment, the electronic device 10*a* is an antenna device. For example, the electronic device 10*a* may be adapted to a communication field, a radar/lidar field, a reconfigurable intelligent surface (RIS) technology or other appropriate fields/technologies, but the disclosure is not limited thereto. In some embodiments, the electronic device 10*a* may be a flexible electronic device, but the disclosure is not limited thereto.

A material of the substrate SB may be, for example, glass, plastic or a combination thereof. For example, the material of the substrate SB may include quartz, sapphire, silicon (Si), germanium (Ge), silicon carbide (SiC), gallium nitride (GaN), silicon germanium (SiGe), polymethyl methacrylate (PMMA), polycarbonate (PC), polyimide (polyimide, PI), polyethylene terephthalate (PET) or other suitable materials or a combination of the above materials, which is not limited by the disclosure.

The conductive layer M0 is, for example, disposed on the substrate SB. In some embodiments, the conductive layer M0 may serve as a pad portion of the electronic device 10*a*. In detail, in the embodiment, the conductive layer M0 is a pad portion for electrically connecting the chip CHIP to an active component to be described later, but the disclosure is not limited thereto. In some other embodiments, the conductive layer M0 may be used as a grounding plate, an electrostatic protection layer, an electromagnetic interference shielding layer, a heat dissipation layer or other layers with other purposes of the electronic device 10*a*. For example, the conductive layer M0 may occupy more than 85% of a surface area of the substrate SB in a top view direction n of the substrate SB for shielding undesired electromagnetic waves, but the disclosure is not limited thereto. In some embodiments, the conductive layer M0 may have a material with low impedance such as copper (Cu), titanium (Ti), silver (Ag), gold (Au), aluminum (Al), tin (Sn), nickel (Ni) or a combination thereof. However, the material of the conductive layer M0 may also be, for example, other suitable materials or a combination of the above materials, which is not limited by the disclosure. In addition, the conductive layer M0 may, for example, include a single-layer structure or a multi-layer structure. For example, the conductive layer M0 may include laminated structures stacked on each other. According to some embodiments, a sublayer M01, a sublayer M02 and a sublayer M03 may be stacked in sequence on the substrate SB. For example, a material of the sublayer M02 may include copper, titanium, silver, gold, aluminum, tin, nickel or a combination thereof, and the sublayer M01 and the sublayer M03 may have the same material or different materials, and the material thereof may include silicon oxide ($SiO_2$), aluminum oxide ($Al_2O_3$), silicon nitride ($Si_3N_4$), titanium nitride (TiN) or a combination thereof, but the disclosure is not limited thereto. In other embodiments, the conductive layer M0 may include a single layer of a copper layer. Where, in the top view direction n of the substrate SB, a thickness T1 of the sublayer M01 and the sublayer M03 is between 10 nm and 200 nm, which may reduce a risk that the sublayer M02 is corroded due to rupture of an upper film layer, thereby improving the reliability, but the disclosure is not limited thereto. According to some embodiments, the sublayer M02 has a thickness T2 between 0.5 μm-5 μm.

In the embodiment, the electronic device 10*a* further includes an insulating layer PV1. The insulating layer PV1 is, for example, disposed between the substrate SB and the conductive layer M0, and in the top view direction n of the substrate SB, a thickness of the insulating layer PV1 is between 0.1 μm-1 μm. In some embodiments, a material of the insulating layer PV1 may be silicon oxide, silicon nitride, silicon oxynitride, or a combination thereof, but the disclosure is not limited thereto. The insulating layer PV1 may, for example, be selected from a material with an appropriate thermal expansion coefficient, or may be selected from a material that produces a stress opposite to the stress generated by the conductive layer M0 during a heating process, may be selected from a material with good adhesion to the conductive layer M0, where the opposite stress means that after being heated, warping directions of the film layers are different, for example, two edges of a film layer are bent upward to form a smiling face or the two edges of the film layer are bent downward to form a crying face. For example, a thermal expansion coefficient of the insulating layer PV1 may be between 0.1-10 ppm/° C. (0.1 ppm/° C.≤thermal expansion coefficient≤10 ppm/° C.). Based on the above, the insulating layer PV1 may have a stress regulating effect, thereby reducing possibility of substrate warpage. In detail, since the material of the conductive layer M0 has a thermal expansion coefficient greater than that of the material of the substrate SB, in the process of forming the electronic device 10*a*, the conductive layer M0 may be subjected to multiple heating processes and affected by thermal stress, so that an edge of the substrate SB has a tendency to warp toward a direction facing the conductive layer M0. In this regard, the arrangement of the insulating layer PV1 may reduce the influence of the thermal stress on the conductive layer M0, so as to reduce the warping phenomenon generated in the substrate SB. According to some embodiments, the substrate SB may be disposed between the insulating layer PV1 and the conductive layer M0, i.e., the insulating layer PV1 and the conductive layer M0 are respectively disposed on two sides of the substrate SB, which may also achieve the effect of reducing the warping phenomenon generated in the substrate SB.

The circuit structure CS is, for example, disposed on the conductive layer M0 and includes at least one opening OP. In the embodiment, the circuit structure CS includes a dielectric layer ME, an active component AC, a light blocking layer BL, an insulating layer ILD, a circuit line CL, a storage capacitor CST, an insulating layer PV3, an insulating layer PV4, a connection pad CP, and a protective layer PL, but the disclosure is not limited thereto. The number of the intermediate film layers of the circuit structure CS may be increased or decreased according to an actual requirement.

The dielectric layer ME is, for example, disposed on the conductive layer M0 and exposes a part of the conductive layer M0. In the embodiment, the dielectric layer ME exposes the uppermost sublayer M03 of the conductive layer M0. In addition, in the embodiment, the dielectric layer ME has a stepped profile MEP. In detail, the dielectric layer ME includes a side surface ME1S, a top surface ME1T, a side surface ME2S, and a top surface ME2T, where the side surface ME1S is connected to a surface of the sublayer M03 of the conductive layer M0, the top surface ME1T is connected to the side surface ME1S, and the side surface ME2S is connected to the top surface ME1T, and the top surface ME2T is connected to the side surface ME2S to form the profile MEP of the dielectric layer ME. According to some embodiments, a corner where the top surface ME2T is connected to the side surface ME2S may have an arc angle, but the disclosure is not limited thereto. Through the design that the corner has the arc angle, rupture of the film layer of the next layer may be reduced, for example, a risk of rupture of the insulating layer ILD deposited on the dielectric layer ME may be reduced.

In the embodiment, the dielectric layer ME may be a multi-layer structure, and the dielectric layer ME may be an insulating material, and the dielectric layer ME includes an insulating layer PV2, a buffer layer BF, and a gate insulating layer GI, but the disclosure is not limited thereto. The number of the intermediate film layers of the dielectric layer ME may be increased or decreased according to an actual requirement. In the top view direction n of the substrate SB, a thicknesses of the insulating layer PV2, the buffer layer BF and the gate insulating layer GI is between 0.1 μm-5 μm, and may be between 0.5 μm-3 μm according to some embodiments.

The insulating layer PV2 is, for example, disposed on the conductive layer M0. In the embodiment, the side surface ME1S, the top surface ME1T and a part of the side surface ME2S of the dielectric layer ME are a profile of the insulating layer PV2. A material of the insulating layer PV2 may be, for example, an inorganic material (for example: silicon oxide, silicon nitride, silicon oxynitride or a stacked layer of at least two of the above materials), an organic material (for example: polyimide resin, epoxy resin or acrylic resin) or a combination of the above materials, but the disclosure is not limited thereto. In some embodiments, the insulation layer PV2 may be a single-layer structure or a multi-layer structure, but the disclosure is not limited thereto.

The buffer layer BF is, for example, disposed on the insulating layer PV2. In the embodiment, another part of the side surface ME2S of the dielectric layer ME is a profile of the buffer layer BF. A material of the buffer layer BF may be, for example, an inorganic material (for example, silicon oxide, silicon nitride, silicon oxynitride, or a stacked layer of at least two of the above materials), but the disclosure is not limited thereto. In some embodiments, the buffer layer BF may be a single-layer structure or a multi-layer structure, which is not limited by the disclosure.

The gate insulating layer GI is, for example, disposed on the buffer layer BF. In the embodiment, the remaining part of the side surface ME2S and the top surface ME2T of the dielectric layer ME are a profile of the gate insulating layer GI. A material of the gate insulating layer GI may be, for example, an inorganic material (for example, silicon oxide, silicon nitride, silicon oxynitride or a stacked layer of at least two of the above materials), but the disclosure is not limited thereto. In some embodiments, the gate insulating layer GI can be a single-layer structure or a multi-layer structure, which is not limited by the disclosure.

The active component AC is, for example, disposed on the substrate SB. In the embodiment, the active component AC is disposed on the buffer layer BF and is electrically connected to the chip CHIP. The active components AC may be disposed on the conductive layer M0 in an array arrangement, a staggered arrangement (for example, a pentile method) or other methods, which is not limited by the disclosure. In the embodiment, the active component AC is a thin film transistor, but the disclosure is not limited thereto. According to some embodiments, in the top view direction n of the substrate SB, the chip CHIP and the active component AC do not overlap, and the above design may avoid crushing the active component AC during a bonding process, but the disclosure is not limited thereto. In detail, the active component AC may include, for example, a gate G, a source S, a drain D, and a semiconductor layer SE, where the semiconductor layer SE is, for example, disposed between the gate G, the source S, and the drain D. A material of the semiconductor layer SE may include, for example, low temperature polysilicon (LTPS), metal oxides, amorphous silicon (a-Si) or a combination thereof, but the disclosure is not limited thereto. For example, the material of the semiconductor layer SE may include but not limited to amorphous silicon, polysilicon, germanium, compound semiconductors (such as gallium nitride, silicon carbide, gallium arsenide, gallium phosphide, indium phosphide, indium arsenide, and/or or indium antimonide), alloy semiconductors (such as an SiGe alloy, a GaAsP alloy, an AlInAs alloy, an AlGaAs alloy, a GalnAs alloy, a GaInP alloy, a GaInAsP alloy), or combinations thereof. The material of the semiconductor layer SE may also include but not limited to metal oxides, such as indium gallium zinc oxide (IGZO), indium zinc oxide (IZO), indium gallium zinc oxide (IGZTO), or organic semiconductors containing polycyclic aromatic compounds, or a combination thereof. In this embodiment, the material of the semiconductor layer SE is amorphous silicon, but the disclosure is not limited thereto. The gate G is, for example, at least partially overlapped with the semiconductor layer SE in the top view direction n of the substrate SB. The source S and the drain D are, for example, separated from each other, and cover at least a part of the semiconductor layer SE, and are respectively electrically connected to the semiconductor layer SE through a through hole VS and a through hole VD. It should be noted that although this embodiment shows that the active component AC may be any top-gate type thin film transistor known to those skilled in the art, the disclosure is not limited thereto. In some embodiments, the conductive layer M0 may be at least partially overlapped with the active component AC in the top view direction n of the substrate SB. In the embodiment, the conductive layer M0 is overlapped with the active component AC in the top view direction n of the substrate SB, but the disclosure is not limited thereto.

The light blocking layer BL is, for example, disposed on the substrate SB and is, for example, covered by the buffer layer BF. In the embodiment, the light blocking layer BL is disposed on the insulating layer PV2 and is located between the insulating layer PV2 and a channel region of the semiconductor layer SE of the active component AC, and the light blocking layer BL is at least partially overlapped with the channel region of the semiconductor layer SE in the top view direction n of the substrate SB, thereby reducing deterioration of the channel region due to irradiation of external ambient light. In some embodiments, ae material of the light blocking layer BL may include materials with a transmittance lower than 30%, but the disclosure is not limited thereto. In addition, in some embodiments, the light blocking layer BL may be electrically connected to the conductive layer M0 through a through hole (not shown) penetrating through the insulating layer PV2.

The insulating layer ILD is, for example, disposed on the dielectric layer ME and, for example, covers the gate G of the active component AC, where the insulating layer ILD may be penetrated by the above-mentioned through hole VS and the through hole VD, so that the source S and the drain D may be respectively electrically connected to the semiconductor layer SE through the through hole VS and the through hole VD. A material of the insulating layer ILD may be, for example, an inorganic material (for example, silicon oxide, silicon nitride, silicon oxynitride, or a stacked layer of at least two of the above materials), but the disclosure is not limited thereto. In some embodiments, the insulating layer ILD may be a single-layer structure or a multi-layer structure, but the disclosure is not limited thereto.

The circuit line CL is, for example, disposed on the insulating layer ILD, and, for example, belongs to a same layer as the source S and the drain D. In the embodiment, one end of the circuit line CL is electrically connected to the source S, and another end of the circuit line CL may be electrically connected to the conductive layer M0 through a through hole VCL penetrating through the insulating layer ILD and the dielectric layer ME. Based on the above, the active component AC may be electrically connected to the conductive layer M0 through the circuit line CL, so as to be electrically connected to the chip CHIP.

The storage capacitor CST is, for example, disposed on the substrate SB and electrically connected to the active component AC. In detail, in the embodiment, the storage capacitor CST is composed of a storage electrode SC1, a storage electrode SC2, and a buffer layer BF disposed between the storage electrode SC1 and the storage electrode SC2, where the storage electrode SC1 and the light blocking layer BL belong to the same layer, and the storage electrode SC2 and the semiconductor layer SE of the active component AC belong to the same layer. The storage electrode SC1 may be electrically connected to a conductive layer M1 (which belongs to the same layer as the gate G) through a through hole VC1 penetrating through the buffer layer BF and the gate insulating layer GI, and the storage electrode SC2' may be electrically connected to a conductive layer M2 (which belongs to the same layer as the source S and the drain D) through, for example, a through hole VC2 penetrating the gate insulating layer GI and the insulating layer ILD, so as to increase a cross-sectional area of the storage electrode SC1 and the storage electrode SC2, thereby increasing a charge storage capacity of the storage capacitor CST, but the disclosure is not limited thereto.

The insulating layer PV3 is, for example, disposed on the insulating layer ILD and, for example, covers the source S and the drain D of the active component AC and the circuit line CL. A material of the insulating layer PV3 may be, for example, an inorganic material (for example, silicon oxide, silicon nitride, silicon oxynitride, or a stacked layer of at least two of the above materials), but the disclosure is not limited thereto. In some embodiments, the insulating layer PV3 may be a single-layer structure or a multi-layer structure, but the disclosure is not limited thereto.

The insulating layer PV4 is, for example, disposed on the insulating layer PV3. A material of the insulating layer PV4 may be, for example, an inorganic material (for example, silicon oxide, silicon nitride, silicon oxynitride, or a stacked layer of at least two of the above materials), but the disclosure is not limited thereto. In some embodiments, the insulating layer PV4 may be a single-layer structure or a multi-layer structure, but the disclosure is not limited thereto.

The connection pad CP is, for example, disposed on the dielectric layer ME. In the embodiment, the connection pad CP includes a connection pad pattern CP1, a connection pad pattern CP2 and a connection pad pattern CP3. The connection pad pattern CP1 is, for example, disposed on the gate insulating layer GI, and belongs to the same layer as the gate G of the active component AC. The connection pad pattern CP2 is, for example, disposed on the insulating layer ILD, and belongs to the same layer as the source S and the drain D of the active component AC. In some embodiments, the insulating layer ILD has a through hole V1 exposing a part of the connection pad pattern CP1, and the connection pad pattern CP2 may be electrically connected to the connection pad pattern CP1 through the through hole V1. The connection pad pattern CP3 is, for example, disposed on the insulating layer PV4, and a material thereof may, for example, include a metal oxide conductive material (for example: indium tin oxide, indium zinc oxide, aluminum tin oxide, aluminum zinc oxide, indium germanium zinc oxide), but the disclosure is not limited thereto. In some embodiments, the insulating layer PV3 has a through hole V2, the insulating layer PV4 has a through hole V3, and the through hole V2 communicates with the through hole V3 to expose a part of the connection pad pattern CP2 together, and the connection pad pattern CP3 may be electrically connected to the connection pad pattern CP2 through the communicated through holes V2 and V3. The connection pad CP may be electrically connected with the active component AC for the purpose of transferring or grounding, but the disclosure is not limited thereto.

The protective layer PL is, for example, disposed between the insulating layer PV3 and the insulating layer PV4, and is covered by the insulating layer PV4. A material of the protective layer PL may be, for example, an organic material (for example, polyimide resin, epoxy resin or acrylic resin), but the disclosure is not limited thereto.

In the embodiment, the dielectric layer ME in the circuit structure CS has the stepped profile MEP, where adjacent dielectric layers ME may form at least one opening OP of the circuit structure CS to expose a part of the conductive layer M0 (sublayer M02). In detail, the opening OP is, for example, defined by a first sub-opening OP1 and a second sub-opening OP2. The first sub-opening OP1 is, for example, defined by a bottom surface of the insulating layer PV2, a side surface of the insulating layer PV2, a side surface of the buffer layer BF, and a side surface of the gate insulating layer GI, and the second sub-opening OP2 is, for example, defined by a top surface of the sublayer M02, a side surface of the sublayer M03, and the side surface of the insulating layer PV2, where the first sub-opening OP1 and the second sub-opening OP2 communicate with each other. In other words, the first sub-opening OP1 and the second sub-opening OP2 communicate with each other to define the at least one opening OP.

The bonding pad BS is, for example, disposed on the circuit structure CS. In the embodiment, the bonding pad BS is disposed in at least one opening OP, and may be electrically connected to the conductive layer M0 through the at least one opening OP. The bonding pad BS includes, for example, a solder BS1 and a bump BS2, where the solder BS1 is disposed on the bump BS2, and a part of the bump BS2 is disposed in the at least one opening OP to electrically connect the conductive layer M1, but the disclosure is not limited thereto. In other embodiments, the bonding pad BS may include structures such as a solder ball, a conductive pillar, etc. A material of the bump BS2 may, for example, include metal or alloy.

The chip CHIP is, for example, disposed on the bonding pad BS. In some embodiments, the chip CHIP may include a communication element. In detail, the chip CHIP may include, for example, a varactor, a variable capacitor, a radio frequency radiation element, a variable resistor, a phase shifter, an amplifier, an antenna, a biometric sensor, a graphene sensor, other suitable elements or combinations thereof. For example, the chip CHIP of the embodiment includes a varactor diode. The varactor diode may provide different capacitance values according to the signal provided by a driving element to be introduced later, i.e., the capacitance value of the varactor diode may be changed by changing a voltage across the varactor diode. Therefore, by adjusting the capacitance value of the varactor diode, an operating frequency band of the electronic device 10*a* of the embodiment may be adjusted, but the disclosure is not limited thereto.

Figure 2:
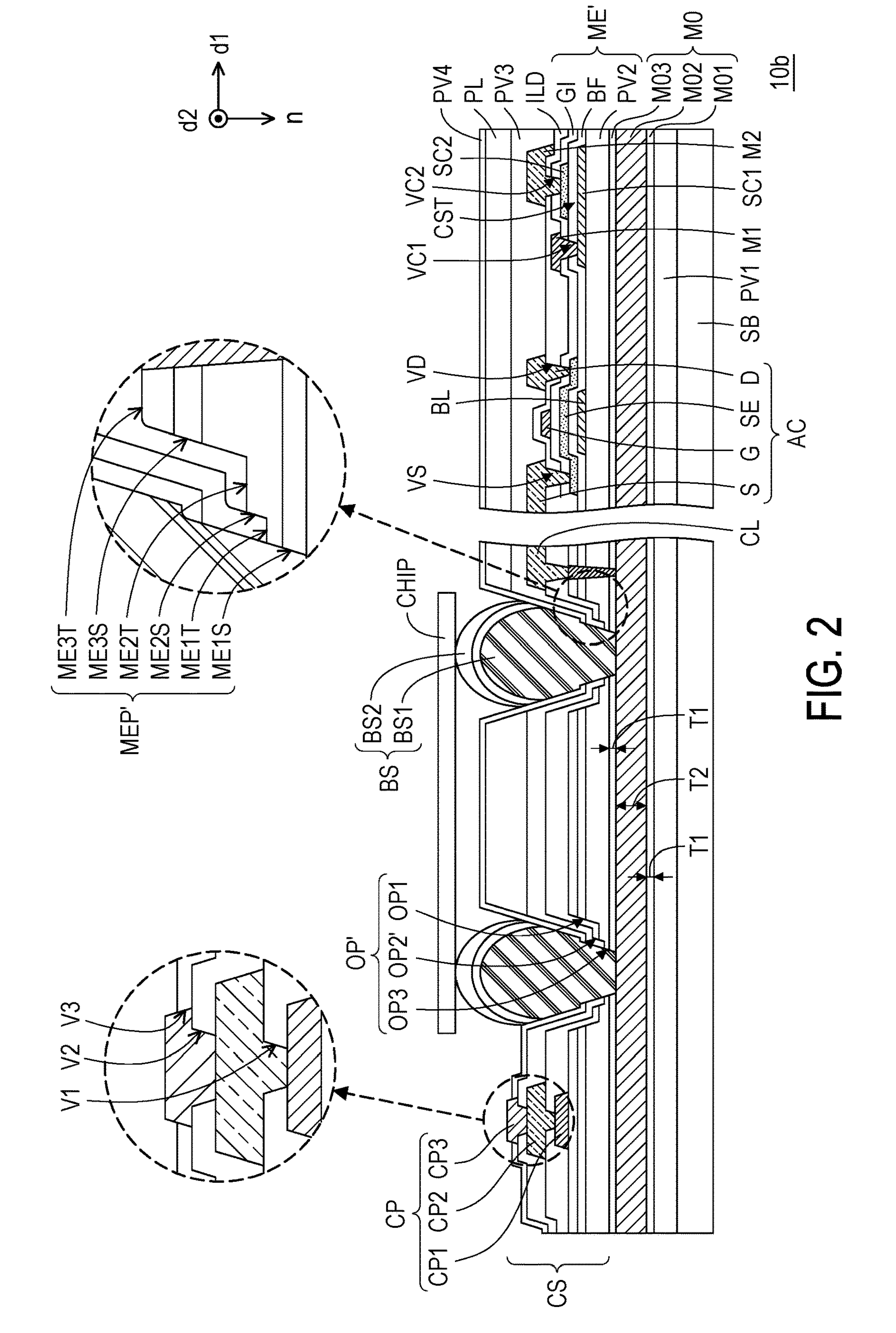
FIG. 2 is a schematic partial cross-sectional view of an electronic device according to a second embodiment of the disclosure.

FIG. 2 is a schematic partial cross-sectional view of an electronic device according to a second embodiment of the disclosure. It should be noted that the embodiment in FIG. 2 may continue to adopt the component referential numbers and a part of the content of the embodiment in FIG. 1, where the same or similar referential numbers are used to indicate the same or similar components, and the description of the same technical content is omitted.

Referring to FIG. 2, a main difference between an electronic device 10*b* of the embodiment and the aforementioned electronic device 10*a* is that: a dielectric layer ME' of the electronic device 10*b* has a different stepped profile MEP'.

In detail, the dielectric layer ME' of the electronic device 10*b* includes a side surface ME1S, a top surface ME1T, a side surface ME2S, a top surface ME2T, a side surface ME3S, and a top surface ME3T, where the side surface ME1S is connected to a surface of the sublayer M03 of the conductive layer M0, the top surface ME1T is connected to the side surface ME1S, the side surface ME2S is connected to the top surface ME1T, the top surface ME2T is connected to the side surface ME2S, the side surface ME3S is connected to the top surface ME2T, and the top surface ME3T is connected to the side surface ME3S to form the profile MEP' of the dielectric layer ME'.

The side surface ME1S, the top surface ME1T, the side surface ME2S, the top surface ME2T and a part of the side surface ME3S of the dielectric layer ME' are a profile of the insulating layer PV2, and another part of the side surface ME3S of the dielectric layer ME' is a profile of the buffer layer BF, and the remaining part of the side surface ME3S and the top surface ME3T of the dielectric layer ME are a profile of the gate insulating layer GI.

In addition, in the embodiment, an opening OP' is, for example, defined by the first sub-opening OP1, a second sub-opening OP2' and the third sub-opening OP3.

The first sub-opening OP1 is, for example, defined by the bottom surface of the insulating layer PV2, the side surface of the insulating layer PV2 (the side surface ME3S of the dielectric layer ME'), the side surface of the buffer layer BF, and the side surface of the gate insulating layer GI, the second sub-opening OP2' is, for example, defined by another side surface of the insulating layer PV2 (the side surface ME2S of the dielectric layer ME') and the side surface of the insulating layer ILD, and the third sub-opening OP3 is, for example, defined by the top surface of the sublayer M02, the side surface of the sublayer M03, and another side surface of the insulating layer PV2 (the side surface ME1S of the dielectric layer ME'), where the first sub-opening OP1 and the second sub-opening OP2' communicate with each other, and the second sub-opening OP2' and the third sub-opening OP3 communicate with each other.

Figure 3A:
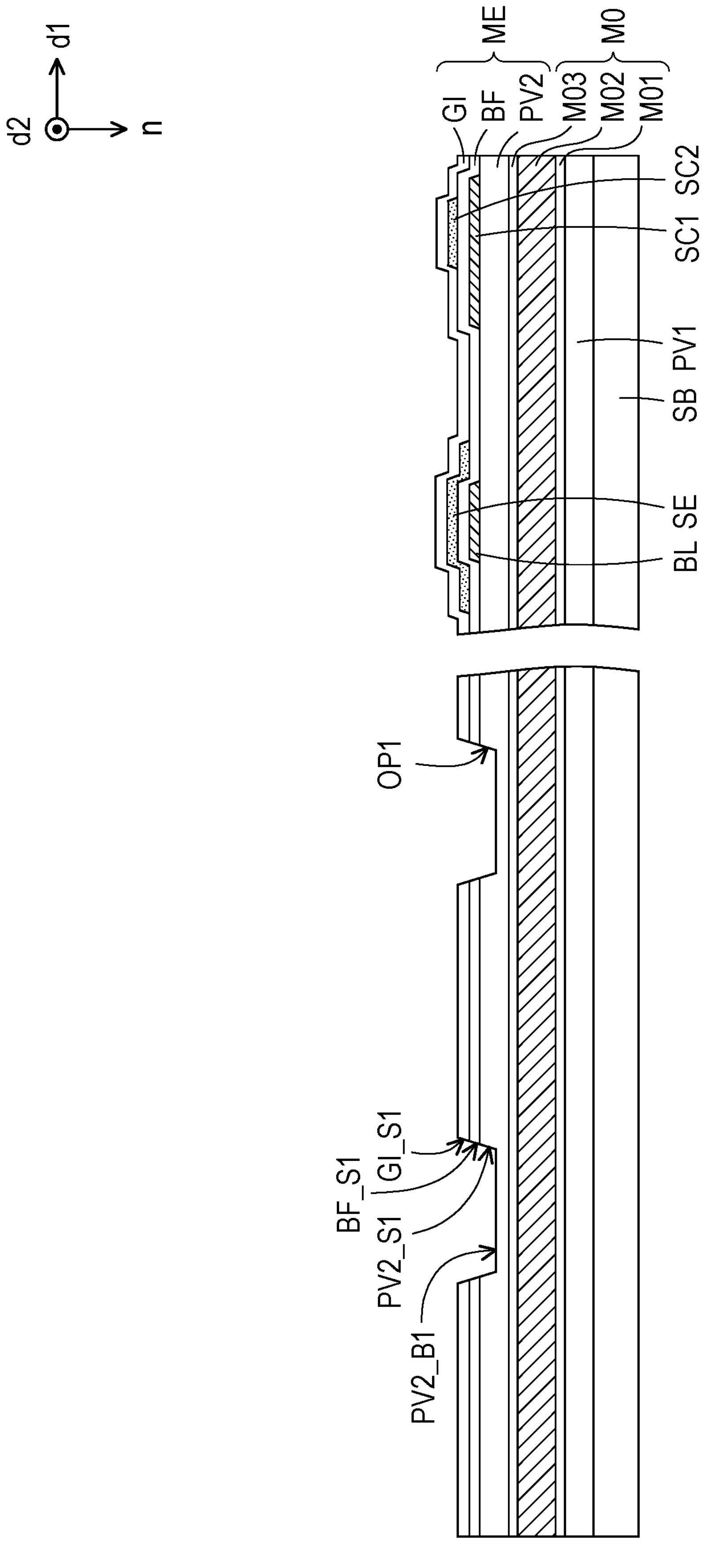
FIG. 3A to FIG. 3C are schematic partial cross-sectional views of a manufacturing method of an electronic device according to the first embodiment of the disclosure.
Figure 3B:
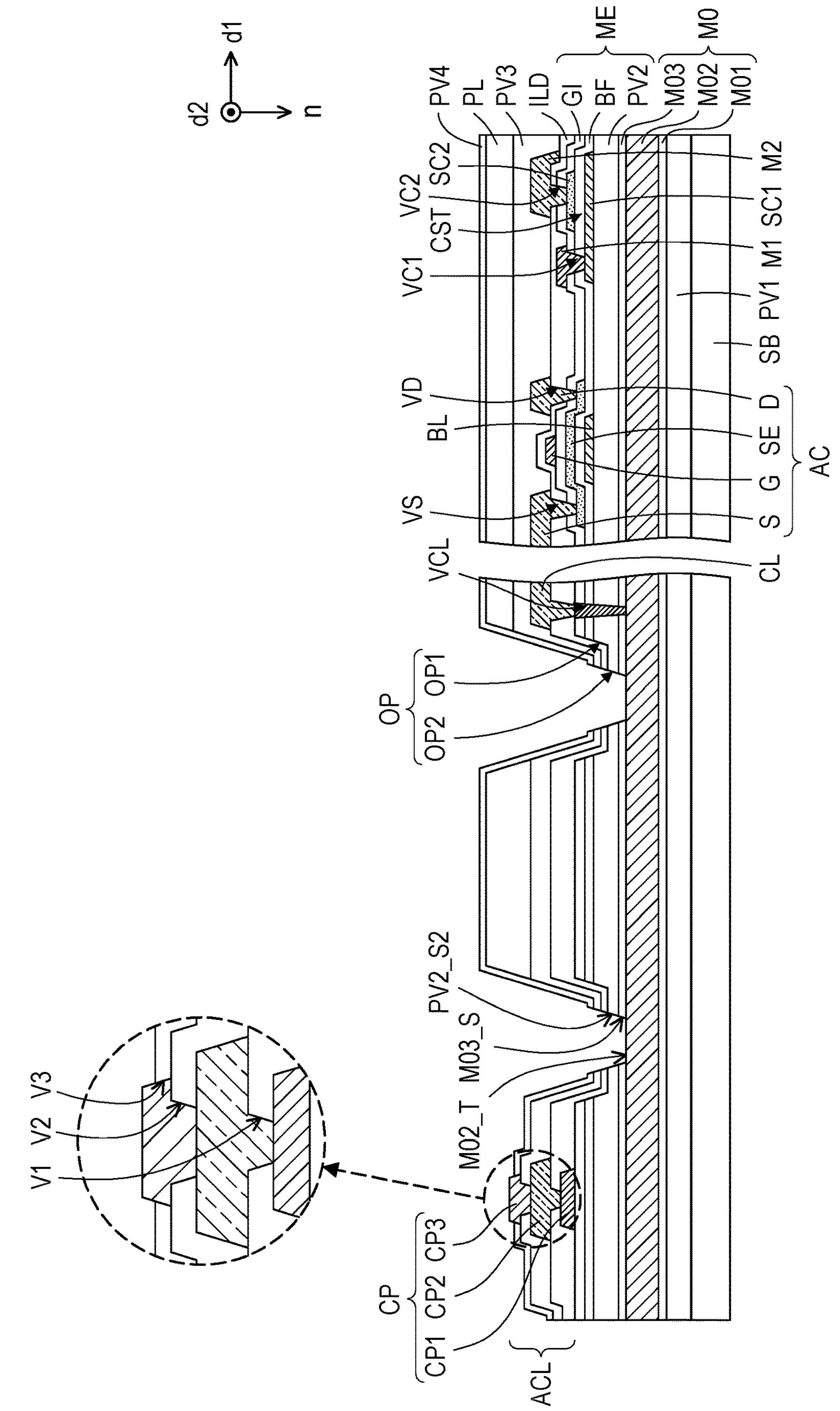
Figure 3C:
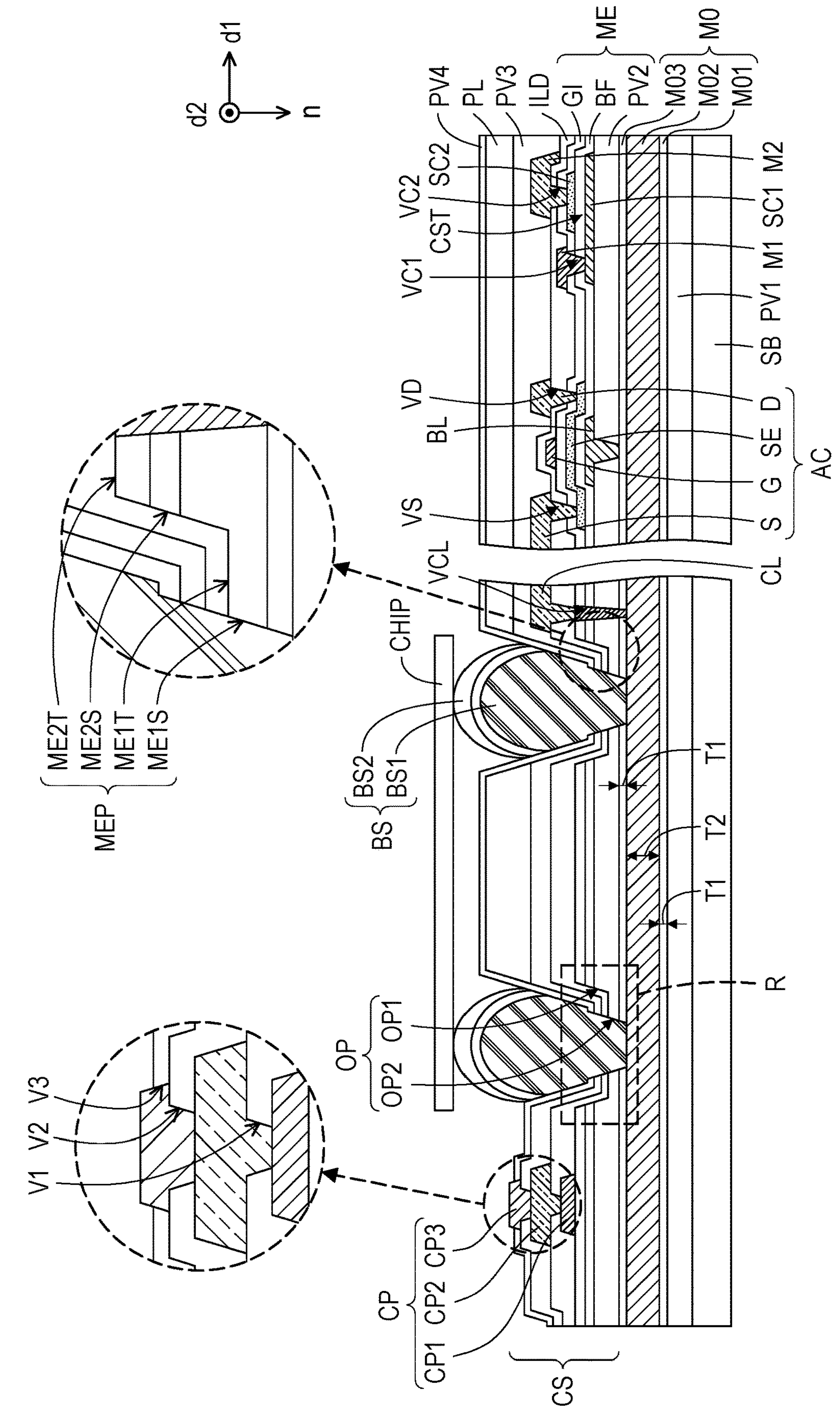
Figure 4:
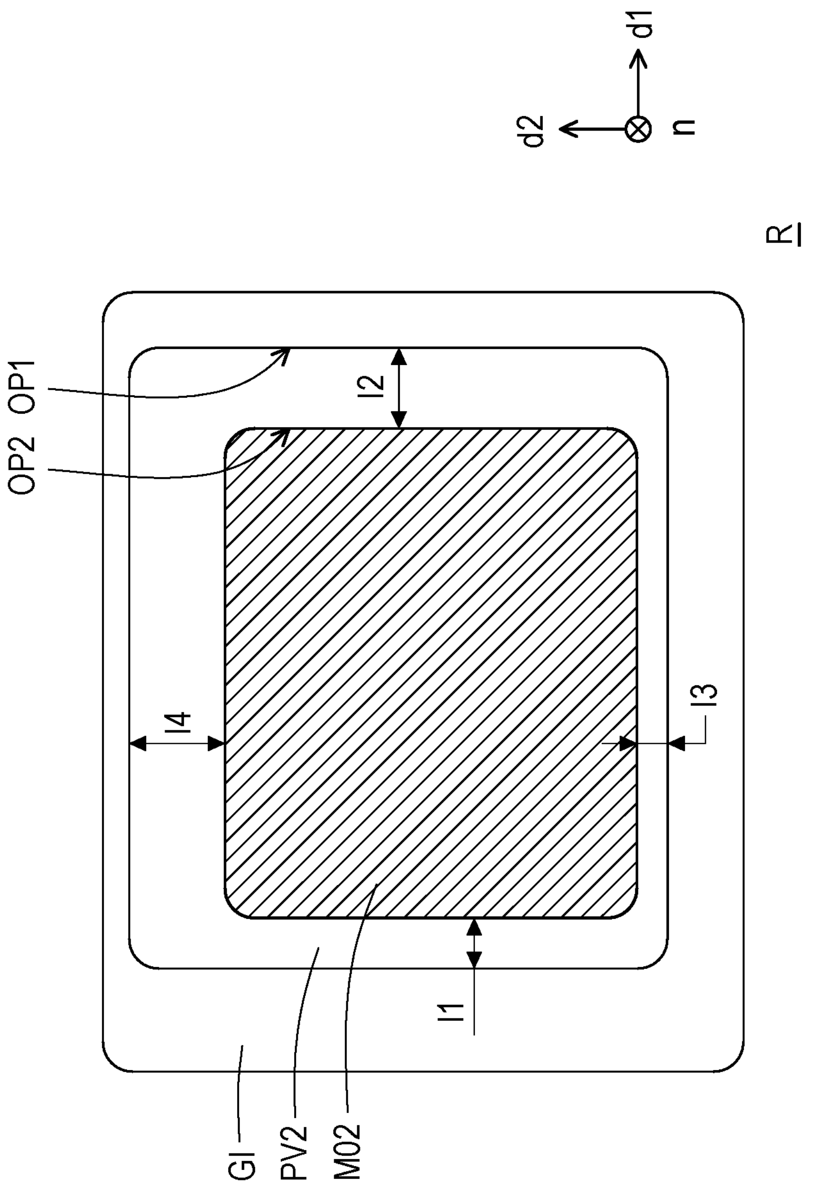
FIG. 4 is a schematic enlarged top view of a region R of FIG. 3C.

FIG. 3A to FIG. 3C are schematic partial cross-sectional views of a manufacturing method of an electronic device according to the first embodiment of the disclosure, and FIG. 4 is a schematic enlarged top view of a region R of FIG. 3C. It may be, for example, a partial manufacturing process of the electronic device 10*a*.

Referring to FIG. 3A, in step (1), the substrate SB is provided. The material included in the substrate SB may refer to the above-mentioned embodiments, which will not be repeated here.

Then, in step (2), the conductive layer M0 is formed on the substrate SB. The method of forming the conductive layer M0 may be, for example, to use physical vapor deposition (PVD), metal chemical vapor deposition (CVD), electroplating, chemical plating, diffusion, photolithography and patterning, laser, coating or other suitable processes to form the conductive layer M0 on the substrate SB, but the disclosure is not limited thereto. The material and structure of the conductive layer M0 may refer to the aforementioned embodiments, and detail thereof is not repeated.

Then, in step (3), the circuit structure CS is formed on the conductive layer M0. The circuit structure CS may be formed, for example, by performing the following steps, but the disclosure is not limited thereto.

In step (a): an insulating layer on the conductive layer M0. In the embodiment, the formed insulating layer includes a multi-layer structure, which includes the insulating layer PV2, the buffer layer BF and the gate insulating layer GI, but the disclosure is not limited thereto.

First, an insulating layer PV2 is formed on the conductive layer M0. The insulating layer PV2 may be formed on the conductive layer M0 by, for example, chemical vapor deposition, a semiconductor process or other suitable processes, which is not limited by the disclosure. The material included in the insulating layer PV2 may refer to the above-mentioned embodiments, and detail thereof is not repeated.

Then, the buffer layer BF is formed on the insulating layer PV2. The buffer layer BF may be formed on the insulating layer PV2 by, for example, chemical vapor deposition, a semiconductor process or other suitable processes, which is not limited by the disclosure. The material included in the buffer layer BF may refer to the above-mentioned embodiments, and detail thereof is not repeated.

In the embodiment, before forming the buffer layer BF on the insulating layer PV2, the light blocking layer BL and the storage electrode SC1 are first formed on the insulating layer PV2, where the buffer layer BF formed later covers the light blocking layer BL and the storage electrode SC1. The light blocking layer BL and the storage electrode SC1 may be formed, for example, by performing the following steps. First, a conductive material layer (not shown) is formed on the insulating layer PV2 by using a physical vapor deposition method or a metal chemical vapor deposition method or other suitable processes, and then the conductive material layer is subjected to a patterning process to respectively form the light blocking layer BL and the storage electrode SC1, but the disclosure is not limited thereto. The materials included in the light blocking layer BL and the storage electrode SC1 and applications thereof may refer to the above-mentioned embodiments, and details thereof are not repeated.

Thereafter, the gate insulating layer GI is formed on the buffer layer BF. The gate insulating layer GI may be formed on the buffer layer BF by, for example, chemical vapor deposition or other suitable processes, which is not limited by the disclosure. The material included in the gate insulating layer GI may refer to the above-mentioned embodiments, and detail thereof is not repeated.

In the embodiment, before forming the gate insulating layer GI on the buffer layer BF, the semiconductor layer SE and the storage electrode SC2 are first formed on the buffer layer BF, where the gate insulating layer GI formed later covers the semiconductor layer SE and the storage electrode SC2. The semiconductor layer SE and the storage electrode SC2 may be formed, for example, by performing the following steps. First, a conductive material layer (not shown) is formed on the buffer layer BF by using a chemical vapor deposition method or other suitable processes, and then the conductive material layer is subjected to a patterning process to respectively form the semiconductor layer SE and the storage electrode SC2, but the disclosure is not limited thereto. The materials included in the semiconductor layer SE and the storage electrode SC2 and applications thereof may refer to the above-mentioned embodiments, and details thereof are not repeated.

In step (b): the insulating layer PV2, the buffer layer BF and the gate insulating layer GI are patterned to form the first sub-opening OP1.

In the embodiment, the first sub-opening OP1 may be formed by performing a lithography process and an etching process. For example, a plurality of photoresist patterns (not shown) may be formed on the gate insulating layer GI first, and then the photoresist patterns are used as a mask to remove a part of the insulating layer PV2, a part of the buffer layer BF and a part of the gate insulating layer GI, so as to form the first sub-opening OP1. The first sub-opening OP1 is defined by, for example, a bottom surface PV2_B1 of the insulating layer PV2, a side surface PV2_S1 of the insulating layer PV2, a side surface BF_S1 of the buffer layer BF, and a side surface GI_S1 of the gate insulating layer GI. From another point of view, the first sub-opening OP1 does not expose the conductive layer M0.

In step (c): an active component layer ACL is formed on the insulating layer PV2.

Referring to FIG. 3B, in the embodiment, after forming the first sub-opening OP1, a gate G is formed on the gate insulating layer GI, where the gate G is, for example, at least partially overlapped with the semiconductor layer SE in the top view direction n of the substrate SB. The gate G may be formed, for example, by performing the following steps. First, a conductive material layer (not shown) is formed on the buffer layer BF by physical vapor deposition or metal chemical vapor deposition or other suitable processes, and then the conductive material layer is patterned to form the gate G, but the disclosure is not limited thereto. The material included in the gate G and applications thereof may refer to the above-mentioned embodiments, and detail thereof is not repeated.

Then, the insulating layer ILD is formed on the gate insulating layer GI, where the insulating layer ILD covers the gate G, and covers the gate insulating layer GI and the buffer layer BF. The insulating layer ILD may be formed on the gate insulating layer GI by, for example, chemical vapor deposition or other suitable processes, which is not limited by the disclosure. The material included in the insulating layer ILD may refer to the above-mentioned embodiments, and detail thereof is not repeated.

Then, the source S and the drain D are formed on the insulating layer ILD, where the source S and the drain D are, for example, separated from each other and are respectively electrically connected to the semiconductor layer SE through the through hole VS and the through hole VD penetrating through the insulating layer ILD and the gate insulating layer GI. The source S and the drain D may be formed, for example, by performing the following steps. First, a conductive material layer (not shown) is formed on the insulating layer ILD by physical vapor deposition or metal chemical vapor deposition or other suitable processes, and then the conductive material layer is subjected to a patterning process to form the source electrode S and the drain D, but the disclosure is not limited thereto. The materials of the source S and the drain D and applications thereof may refer to the above-mentioned embodiments, and details thereof are not repeated.

By now, the active component AC is formed on the insulating layer PV2, where the active component AC includes the above-mentioned gate G, source S, drain D and semiconductor layer SE.

Then, the insulating layer PV3 is formed on the insulating layer ILD, where the insulating layer PV3 covers the source S and the drain D. The insulating layer PV3 may be formed on the insulating layer ILD by, for example, chemical vapor deposition or other suitable processes, which is not limited by the disclosure. The material included in the insulating layer PV3 may refer to the above-mentioned embodiments, and detail thereof is not repeated.

Thereafter, the protective layer PL and the insulation layer PV4 are formed on the insulation layer PV3, where the insulation layer PV4 covers the protective layer PL. The protective layer PL and the insulating layer PV4 may be formed on the insulating layer PV3 by, for example, chemical vapor deposition or other suitable processes, which is not limited by the disclosure. The materials included in the protective layer PL and the insulating layer PV4 may refer to the above-mentioned embodiments, and details thereof are not repeated.

In step (d): the active component layer ACL is patterned to form the second sub-opening OP2.

In the embodiment, the second sub-opening OP2 may be formed by performing a lithography process and an etching process. For example, a plurality of photoresist patterns (not shown) may be formed on the insulating layer PV4 first, and then the photoresist patterns are used as a mask to remove a part of the insulating layer PV4, a part of the insulating layer PV3, a part of the insulating layer PV2 and a part of the sublayer M03 to form the second sub-opening OP2. The second sub-opening OP2 is, for example, defined by a top surface M02_T of the sublayer M02, a side surface M03_S of the sublayer M03, and a side surface PV2_S2 of the insulating layer PV2. Viewed from another angle, the second sub-opening OP2 exposes the conductive layer M0.

In the embodiment, the second sub-opening OP2 corresponds to the first sub-opening OP1 in the top view direction n of the substrate SB to define the opening OP. In detail, after the first sub-opening OP1 is formed, the bottom surface PV2_B1 of the insulating layer PV2 is exposed due to the removal of a part of the insulating layer PV2. Thereafter, an etching process is performed on a part of the bottom surface PV2_B1 exposing the insulating layer PV2 to continually remove a part of the insulating layer PV2 and also remove a part of the sublayer M03 until the top surface M02_T of the sublayer M02 is exposed. Through the above-mentioned process of forming the first sub-opening OP1 and the second sub-opening OP2, the formation of the first sub-opening OP1 and the second sub-opening OP2 defines the stepped profile MEP of the dielectric layer ME (including the insulating layer PV2, the buffer layer BF and the gate insulating layer G1), where the features of the profile MEP of the dielectric layer ME have been described in the above embodiments, so that details thereof are not repeated. Relatively, as corresponding to the profile MEP of the dielectric layer ME, the opening OP also has a stepped profile.

Referring to FIG. 4, FIG. 4 shows the insulating layer PV2 defining a part of the second sub-opening OP2, the gate insulating layer GI defining a part of the first sub-opening OP1, and the exposed sublayer M02, where the second sub-opening OP2 and the first sub-opening OP1 may, for example, have intervals in the first direction d1 and the second direction d2, where the first direction d1 and the second direction d2 are orthogonal, and the first direction d1 and the second direction d2 are orthogonal to the top view direction n of the substrate SB. In detail, there is an interval I1 between the second sub-opening OP2 and the first sub-opening OP1 in the first direction d1, and there is an interval I2 between the second sub-opening OP2 and the first sub-opening OP1 in a direction opposite to the first direction d1. There is an interval I3 between the second sub-opening OP2 and the first sub-opening OP1 in the second direction d2, and there is an interval I4 between the second sub-opening OP2 and the first sub-opening OP1 in a direction opposite to the second direction d2. In the embodiment, the interval I1, the interval I2, the interval I3 and the interval I4 are at least greater than or equal to 5 μm. Since a process deviation probably generated when forming the second sub-opening OP2 is about 2 μm, by making the interval I1, the interval I2, the interval I3, and the interval I4 to be at least greater than or equal to 5 μm, it is possible to reduce the increased difficulty of forming the bonding pad BS caused by a poor shape of the opening OP due to the process deviation probably generated when forming the second sub-opening OP2; or reduce problems such as short circuit between the subsequently formed bonding pad BS and other conductive layers.

Referring to FIG. 3C, in the embodiment, after forming the at least one opening OP, step (4) is performed to form the bonding pad BS in the at least one opening OP.

A material and structure of the bonding pad BS may refer to the above-mentioned embodiments, and detail thereof is not repeated. In some embodiments, the bump BS2 in the bonding pad BS may be formed in the at least one opening OP first. In the embodiment, a material of the bump BS2 in the bonding pad BS may be an alloy of gold and nickel, which may be formed by an electroless nickel immersion gold (ENIG) technology, but the disclosure is not limited thereto. Then, the solder BS1 may be formed on the bump BS2 by electroplating, printing, reflow or other suitable processes, but the disclosure is not limited thereto.

In some embodiments, before forming the bonding pad BS in the at least one opening OP, a surface treatment process may be performed on the top surface M02_T of the sublayer M02 exposed by the at least one opening OP. The surface treatment process may, for example, be used to remove or reduce residues to clean the top surface M02_T of the sublayer M02, where the residues may, for example, include a primary oxide film (for example, copper oxide), etc. The surface treatment process performed on the exposed top surface M02_T of the sublayer M02 may, for example, include performing a sandblasting process on the top surface M02_T of the sub-layer M02 with abrasives, performing a micro-etching process on the top surface M02_T of the sublayer M02, or performing other suitable processes, so that the top surface M02_T of the sublayer M02 becomes relatively rough, and the subsequently formed bonding pad BS and the sublayer M02 may achieve a better bonding effect.

In addition, in the embodiment, after forming the bonding pad BS in the at least one opening OP, in step (5): the chip CHIP is provided on the bonding pad BS, where the chip CHIP is electrically connected to the conductive layer M0. The chip CHIP may be, for example, bonded to the bonding pad BS through a suitable process (such as a pick-and-place technology), but the disclosure is not limited thereto. The type and function of the chip CHIP may refer to the above-mentioned embodiments, and details thereof are not repeated.

Figure 5A:
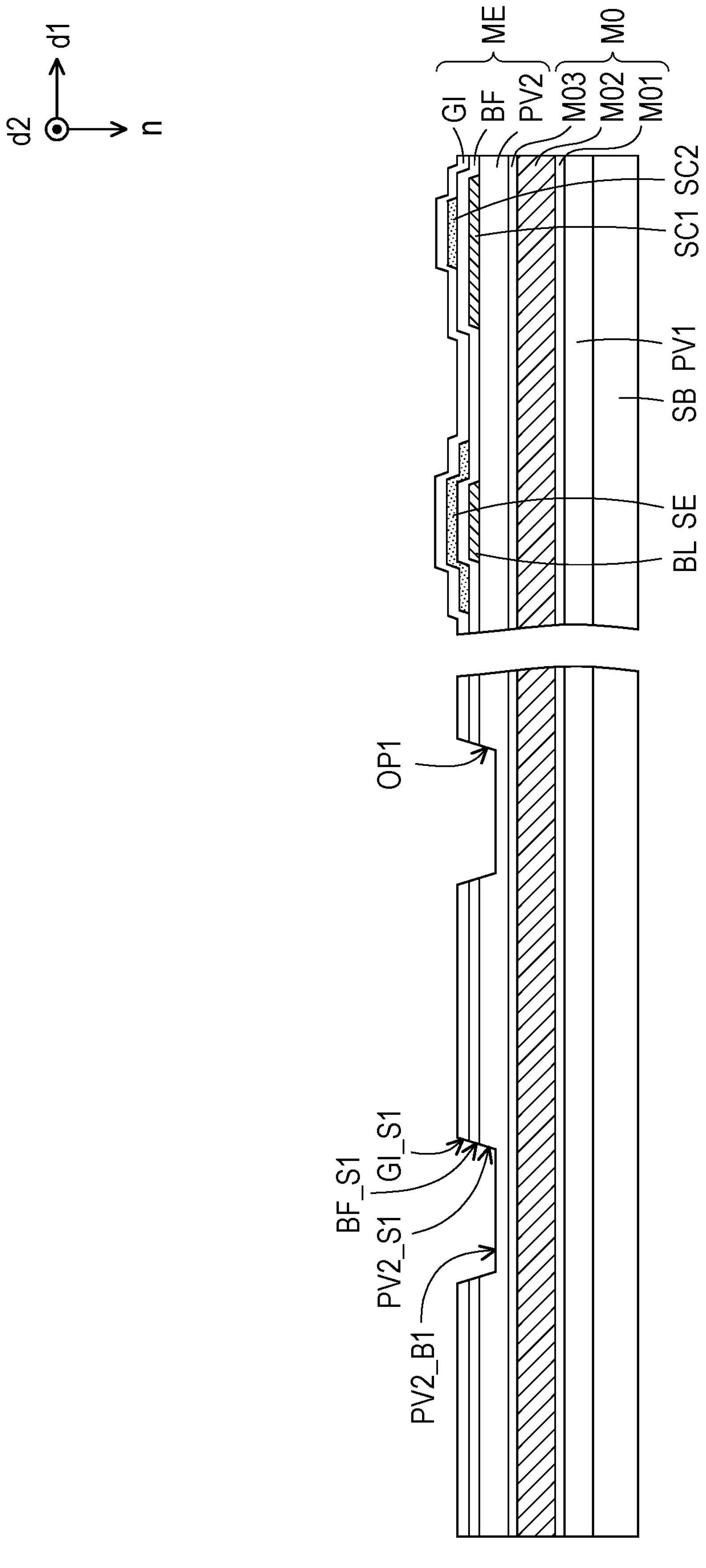
FIG. 5A to FIG. 5D are schematic partial cross-sectional views of a manufacturing method of an electronic device according to the second embodiment of the disclosure.
Figure 5B:
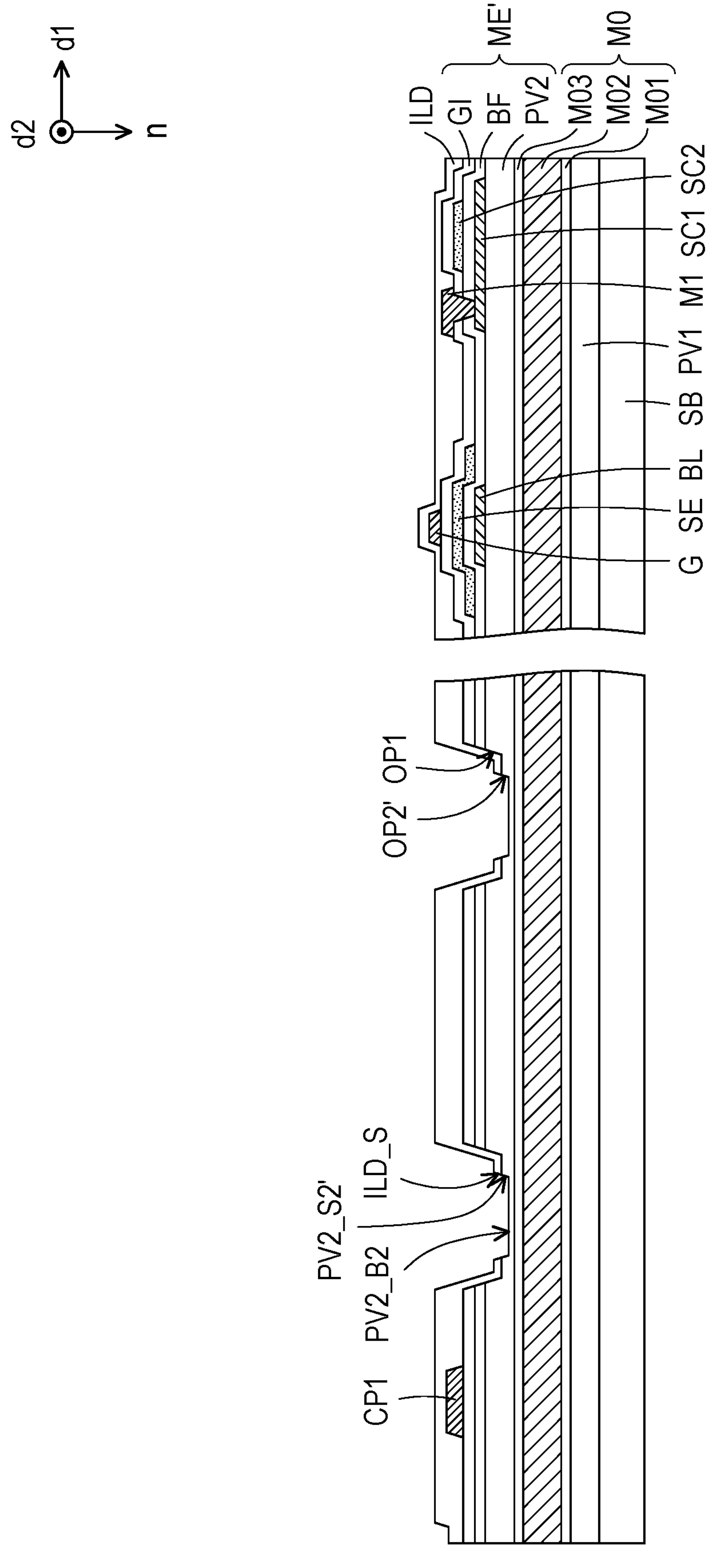
Figure 5C:
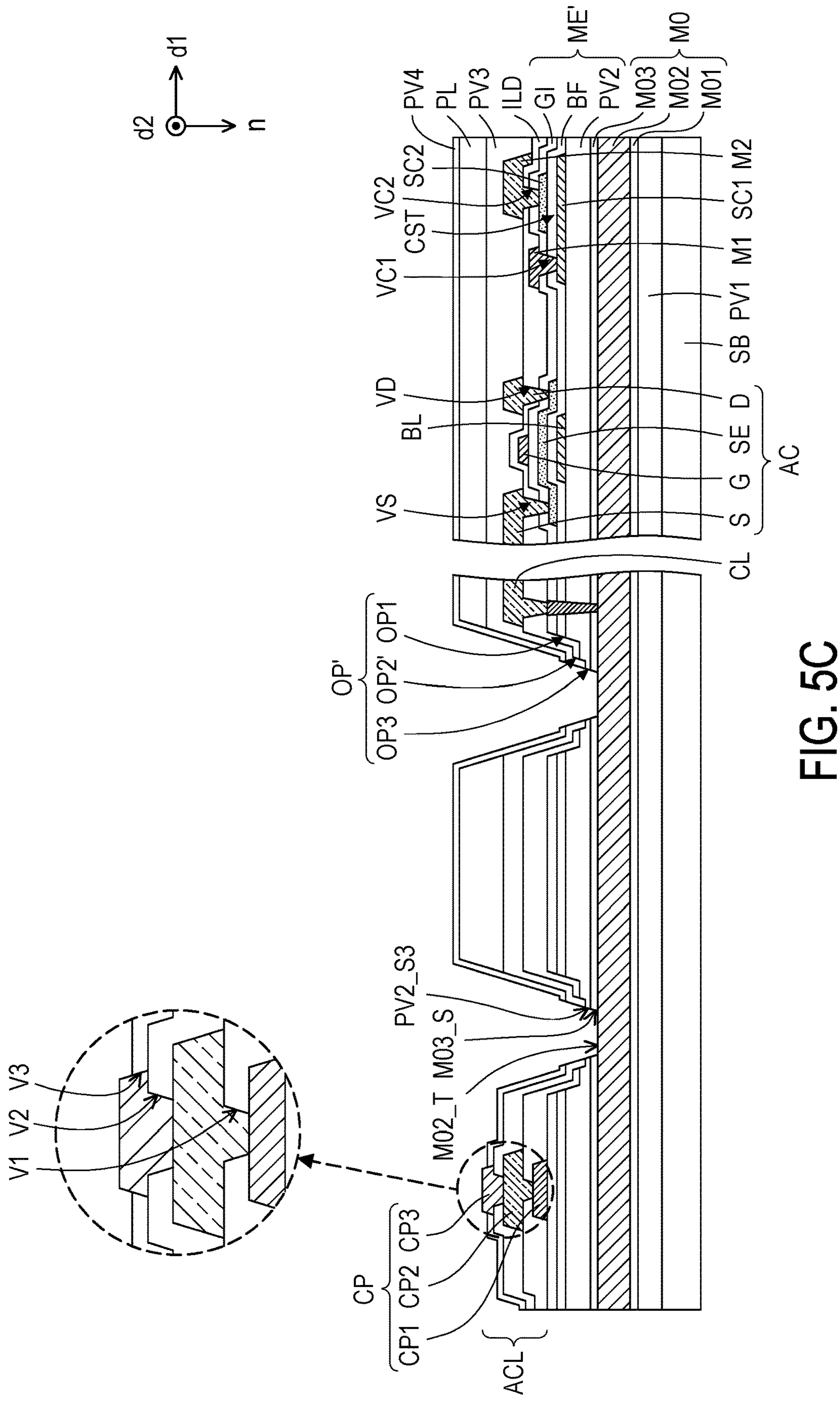
Figure 5D:
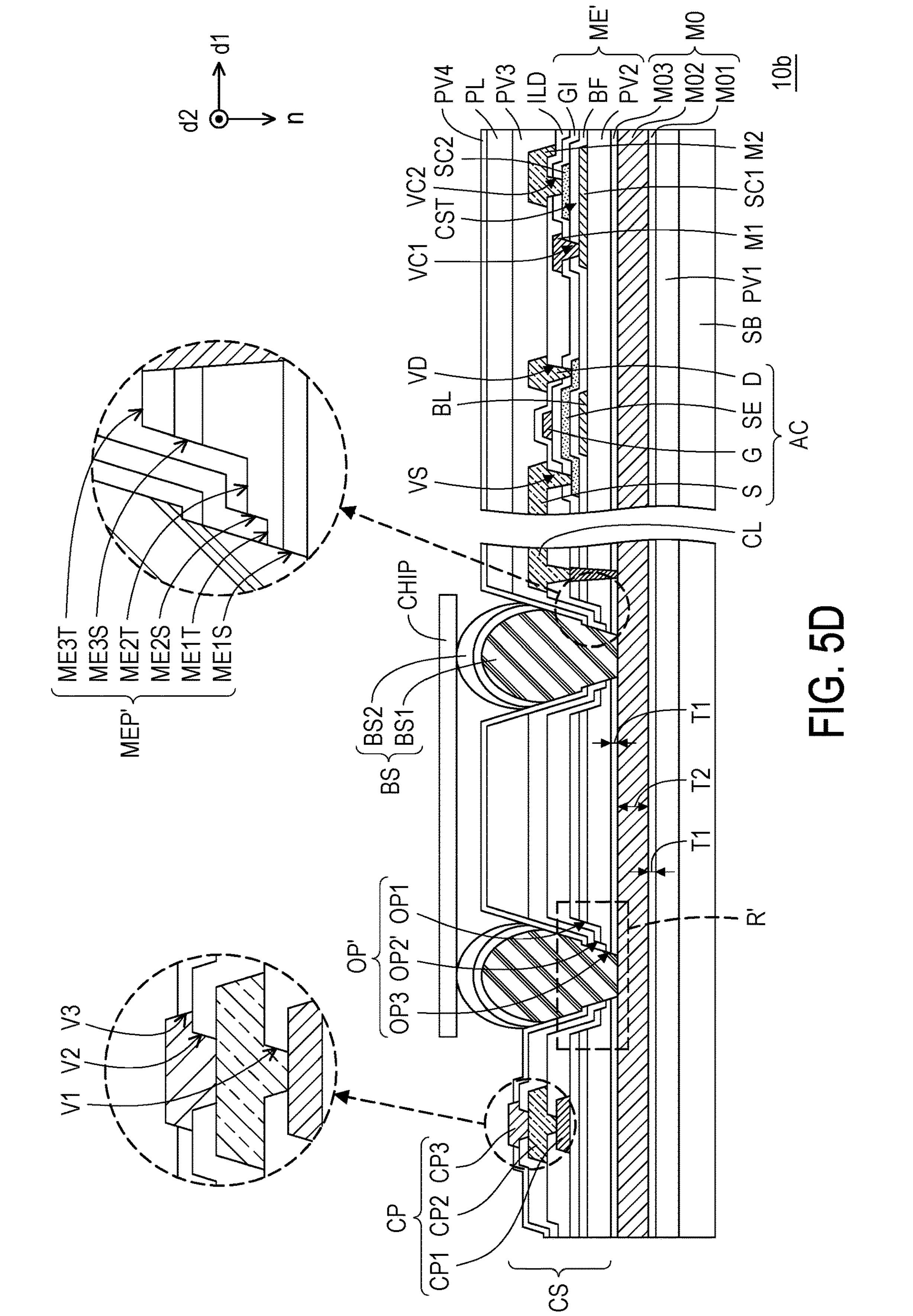
Figure 6:
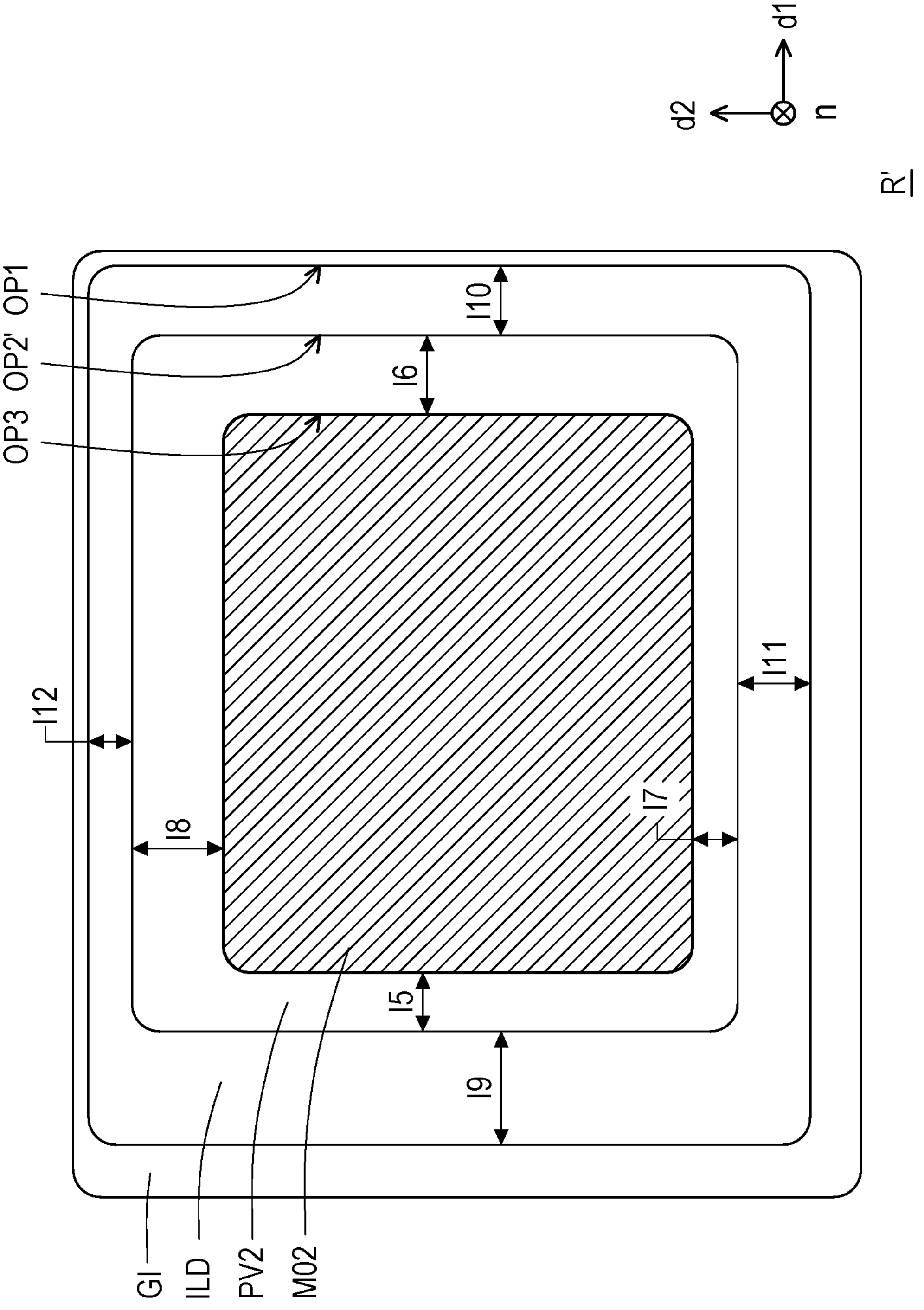
FIG. 6 is a schematic enlarged top view of a region R' of FIG. 5D.

FIG. 5A to FIG. 5D are schematic partial cross-sectional views of a manufacturing method of an electronic device according to the second embodiment of the disclosure, and FIG. 6 is a schematic enlarged top view of a region R' of FIG. 5D, which may be, for example, a partial manufacturing process of the electronic device 10*b*. It should be noted that the embodiment of FIG. 5A to FIG. 5D and FIG. 6 may respectively use the component referential numbers and a part of content of the embodiment of FIG. 3A to FIG. 3C and FIG. 4, where the same or similar referential numbers are used to denote the same or similar components, and descriptions of the same technical contents are omitted.

Referring to FIG. 5A, in step (1): the substrate SB is provided.

Then, in step (2): the conductive layer M0 is formed on the substrate SB.

Then, in step (3'): the circuit structure CS is formed on the conductive layer M0. The circuit structure CS may be formed, for example, by performing the following steps, but the disclosure is not limited thereto.

In step (a), the insulating layer PV2, the buffer layer BF and the gate insulating layer GI are formed on the conductive layer M0.

In step (b), the insulating layer PV2, the buffer layer BF, and the gate insulating layer GI are patterned to form the first sub-opening OP1.

In step (c'): the active component layer ACL is formed on the insulating layer PV2.

Referring to FIG. 5B and FIG. 5C, in the embodiment, after forming the first sub-opening OP1, the gate G is formed on the gate insulating layer GI, where the gate G is, for example, at least partially overlapped with the semiconductor layer SE in the top view direction n of the substrate SB.

Then, the insulating layer ILD is formed on the gate insulating layer GI, where the insulating layer ILD covers the gate G, and covers the gate insulating layer GI and the buffer layer BF.

Thereafter, the insulating layer ILD is patterned to form the second sub-opening OPT. In the embodiment, the insulating layer PV2 is further patterned to form the second sub-opening OPT.

In the embodiment, the second sub-opening OPT may be formed by performing a lithography process and an etching process. For example, a plurality of photoresist patterns (not shown) may be formed on the insulating layer ILD first, and then the photoresist patterns are used as a mask to remove a part of the insulating layer ILD and a part of the insulating layer PV2 to form the second sub-opening OPT. The second sub-opening OPT is, for example, defined by a top surface PV2_B2 of the insulating layer PV2, a side surface PV2_S2' of the insulating layer PV2, and a side surface ILD_S of the insulating layer ILD.

Then, the source S and the drain D are formed on the insulating layer ILD, where the source S and the drain D are, for example, separated from each other and are respectively electrically connected to the semiconductor layer SE through the through hole VS and the through hole VD penetrating through the insulating layer ILD and the gate insulating layer GI.

By now, the active component AC is formed on the insulating layer PV2, where the active component AC includes the above-mentioned gate G, source S, drain D and semiconductor layer SE.

Then, the insulating layer PV3 is formed on the insulating layer ILD, where the insulating layer PV3 covers the source S and the drain D.

Thereafter, the protective layer PL and the insulating layer PV4 are formed on the insulating layer PV3, where the insulating layer PV4 covers the protective layer PL.

In step (d'): the active component layer ACL is patterned to form the third sub-opening OP3.

In the embodiment, the third sub-opening OP3 may be formed by performing a lithography process and an etching process. For example, a plurality of photoresist patterns (not shown) may be formed on the insulating layer PV4 first, and then the photoresist patterns are used as a mask to remove a part of the insulating layer PV4, a part of the insulating layer PV3, a part of the insulating layer PV2 and a part of the sublayer M03 to form the third sub-opening OP3. The third sub-opening OP3 is, for example, defined by the top surface M02_T of the sublayer M02, the side surface M03_S of the sublayer M03, and a side surface PV2_S3 of the insulating layer PV2. Viewed from another angle, the third sub-opening OP3 exposes the conductive layer M0.

In the embodiment, the third sub-opening OP3, the second sub-opening OPT correspond to the first sub-opening OP1 in the top view direction n of the substrate SB to define the opening OP'. In detail, after the first sub-opening OP1 is formed, the bottom surface PV2_B1 of the insulating layer PV2 is exposed due to the removal of a part of the insulating layer PV2. Thereafter, an etching process is performed on a part of the bottom surface PV2_B1 exposing the insulating layer PV2 to continually remove a part of the insulating layer PV2 to expose the bottom surface PV2_B2 of the insulating layer PV2. Then, an etching process is performed on a part of the bottom surface PV2_B2 exposing the insulating layer PV2 to continually remove a part of the insulating layer PV2 and also remove a part of the sublayer M03 till exposing the top surface M02_T of the sublayer M02. Through the above-mentioned process of forming the first sub-opening OP1, the second sub-opening OPT and the third sub-opening OP3, the formation of the first sub-opening OP1, the second sub-opening OPT and the third sub-opening OP3 defines the stepped profile MEP' of the dielectric layer ME' (including the insulating layer PV2, the buffer layer BF and the gate insulating layer G1), where the features of the profile MEP' of the dielectric layer ME' have been described in the above embodiments, so that details thereof are not repeated. Relatively, as corresponding to the profile MEP of the dielectric layer ME, the opening OP' also has a stepped profile.

Referring to FIG. 5D, in the embodiment, after forming the at least one opening OP', step (4) is performed to form the bonding pad BS in the at least one opening OP'.

In some embodiments, before forming the bonding pad BS in the at least one opening OP', a surface treatment process may be performed on the top surface M02_T of the exposed sublayer M02, so that the top surface M02_T of the sublayer M02 becomes relatively rough, and the subsequently formed bonding pad BS and the sublayer M02 may achieve a better bonding effect.

In addition, in the embodiment, after forming the bonding pad BS in the at least one opening OP', in step (5): the chip CHIP is provided on the bonding pad BS, where the chip CHIP is electrically connected to the conductive layer M0. The chip CHIP may be, for example, bonded to the bonding pad BS through a suitable process (such as a pick-and-place technology), but the disclosure is not limited thereto.

Referring to FIG. 6, FIG. 6 shows the insulating layer PV2 defining a part of the third sub-opening OP3, the gate insulating layer GI defining a part of the first sub-opening OP1, and the exposed sublayer M02, where the third sub-opening OP3 and the second sub-opening OP2 may, for example, have intervals in the first direction d1 and the second direction d2, and the second sub-opening OP2 and the first sub-opening OP1 may, for example, have intervals in the first direction d1 and the second direction d2. In detail, there is an interval I5 between the third sub-opening OP3 and the second sub-opening OPT in the first direction d1, and there is an interval I6 between the third sub-opening OP3 and the second sub-opening OPT in a direction opposite to the first direction d1. There is an interval I7 between the third sub-opening OP3 and the second sub-opening OPT in the second direction d2, and there is an interval I8 between the third sub-opening OP3 and the second sub-opening OPT in a direction opposite to the second direction d2. In addition, there is an interval I9 between the second sub-opening OPT and the first sub-opening OP1 in the first direction d1, and there is an interval I10 between the second sub-opening OPT and the first sub-opening OP1 in the direction opposite to the first direction d1. There is an interval I11 between the second sub-opening OPT and the first sub-opening OP1 in the second direction d2, and there is an interval I12 between the second sub-opening OPT and the first sub-opening OP1 in the direction opposite to the second direction d2. In the embodiment, the interval I5, the interval I6, the interval I7, the interval I8, the interval I9, the interval I10, the interval I11, and the interval I12 are at least greater than or equal to 5 μm. Since a process deviation generated when forming the second sub-opening OPT and the third sub-opening OP3 is about 2 μm, by making the interval I5, the interval I6, the interval I7, the interval I8, the interval I9, the interval I10, the interval I11, and the interval I12 to be at least greater than or equal to 5 μm, it is possible to reduce the increased difficulty of forming the bonding pad BS caused by a poor shape of the opening OP' due to the process deviation generated when forming the second sub-opening OPT and the third sub-opening OP3; or reduce problems such as short circuit between the subsequently formed bonding pad BS and other conductive layers.

Figure 7A:
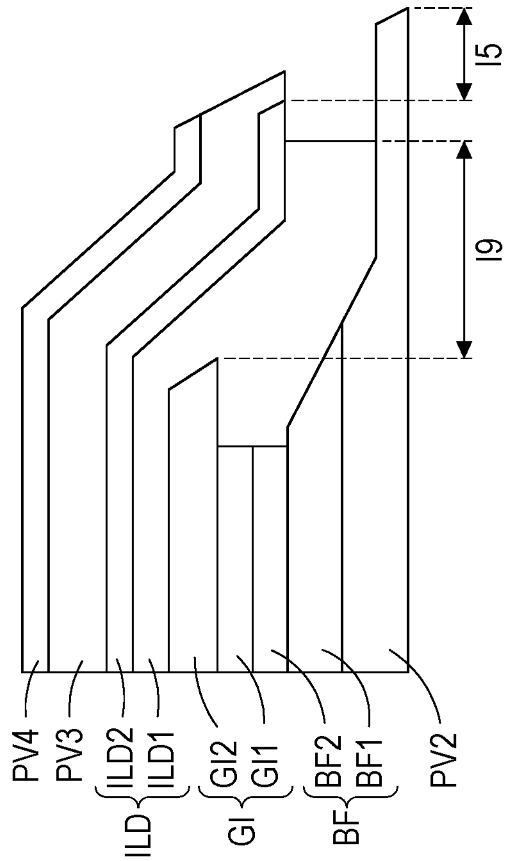
FIG. 7A is a schematic partial enlarged view of a stepped profile of an opening of an electronic device viewed along a section line A-A' of FIG. 6 according to an embodiment.

FIG. 7A is a schematic partial enlarged view of a stepped profile of an opening of an electronic device viewed along a section line A-A' of FIG. 6 according to an embodiment.

In the embodiment, the etching process for forming the first sub-opening OP1, the second sub-opening OPT, and the third sub-opening OP3 includes a wet etching process, a dry etching process or a combination thereof. In the wet etch process, silicon oxide is etched at a higher rate than silicon nitride. In contrast, in the dry etching process, silicon oxide is etched at a lower rate than silicon nitride.

In the embodiment shown in FIG. 7A, (1) a material of the insulating layer PV2 is silicon nitride; (2) the buffer layer BF includes a buffer layer BF1 and a buffer layer BF2 stacked in sequence, where a material of the buffer layer BF1 is silicon nitride, and a material of the buffer layer BF2 is silicon oxide; (3) the gate insulating layer GI includes a gate insulating layer GI1 and a gate insulating layer GI2 stacked in sequence, where a material of the gate insulating layer GI1 is silicon oxide, and a material of the gate insulating layer GI2 is silicon nitride; (4) the insulating layer ILD includes an insulating layer ILD1 and an insulating layer ILD2 stacked in sequence, where a material of the insulating layer ILD1 is silicon oxide, and a material of the insulating layer ILD2 is silicon nitride; (5) a material of the insulating layer PV3 is silicon nitride; (6) a material of the insulating layer PV4 is silicon nitride.

The first sub-opening OP1, the second sub-opening OPT and the third sub-opening OP3 shown in FIG. 7A are all formed by performing a wet etching process. Therefore, an edge of the gate insulating layer GI1 will be more retracted relative to the gate insulating layer GI2 due to a higher etching rate, and an edge of the insulating layer ILD1 will be more retracted than the insulating layer ILD2 due to the higher etching rate.

Figure 7B:
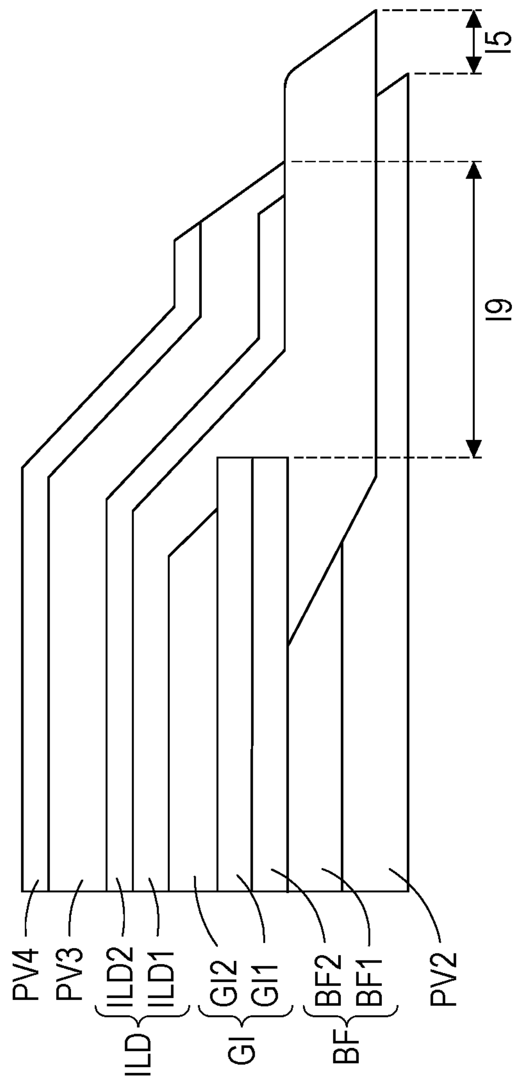
FIG. 7B is a schematic partial enlarged view of a stepped profile of an opening of an electronic device viewed along a section line A-A' of FIG. 6 according to another embodiment.

FIG. 7B is a schematic partial enlarged view of a stepped profile of an opening of an electronic device viewed along a section line A-A' of FIG. 6 according to another embodiment. It should be noted that the embodiment of FIG. 7B may continue to use the component referential numbers and a part of the content of the embodiment of FIG. 7A, where the same or similar referential numbers are used to indicate the same or similar components, and the description of the same technical content is omitted.

Referring to FIG. 7B, a main difference between the present embodiment and the embodiment shown in FIG. 7A is that the first sub-opening OP1, the second sub-opening OPT and the third sub-opening OP3 shown in FIG. 7B are all formed by performing a dry etching process. Therefore, the edge of the gate insulating layer GI1 will be more protruding than the gate insulating layer GI2 due to the lower etching rate, and the edge of the insulating layer ILD1 will be more protruding than the insulating layer ILD2 due to the lower etching rate.

Based on the above, according to the etching rates of different insulating materials relative to different etching processes, the etching process for forming the first sub-opening OP1, the second sub-opening OPT and the third sub-opening OP3 includes collaboration of the wet etching process and the dry etching process, so that the defined opening OP' may have a more complete stepped profile, thereby further reducing the possibility of defects generated in the formed opening OP', and improving the reliability of the electronic device 10*b* of the embodiment.

It should be noted that the embodiment is also applicable to the first sub-opening OP1 and the second sub-opening OP2 in the electronic device 10*a* defining the opening OP.

In summary, in the electronic device and the manufacturing method thereof in some embodiments of the disclosure, the opening for bonding the bonding pad of the chip to the conductive layer may have a stepped profile by, for example, performing multiple etching processes, thereby reducing the possibility of defects generated in the formed through holes, and improving the reliability of the electronic device of the disclosure.

In addition, in the electronic device and the manufacturing method thereof in some embodiments of the disclosure, the opening for bonding the bonding pads of the chip to the conductive layer is defined by a plurality of sub-openings, where the sub-openings are formed through combination of a wet etching process and a dry etching process, so that the formed opening has a more complete stepped profile, thereby further reducing the possibility of defects in the formed through holes, and improving the reliability of the electronic device of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A manufacturing method of an electronic device, comprising:

providing a substrate;

forming a conductive layer on the substrate;

forming a circuit structure on the conductive layer; and patterning the circuit structure to form at least one opening, wherein the at least one opening has a stepped profile; wherein forming the circuit structure on the conductive layer comprises:

forming a dielectric layer on the conductive layer, wherein the conductive layer is located between the dielectric layer and the substrate;

patterning the dielectric layer to form a first sub-opening;

forming an active component layer on the dielectric layer, wherein the dielectric layer is located between the active component layer and the conductive layer; and patterning the active component layer and a portion of the dielectric layer to form a second sub-opening, wherein the second sub-opening corresponds to the first sub-opening in a top view direction of the substrate to define the at least one opening.

2. The manufacturing method of the electronic device according to claim 1, wherein the dielectric layer comprises a multi-layer structure.

3. The manufacturing method of the electronic device according to claim 1, wherein an etching process is performed to form the first sub-opening and the second sub-opening, and the etching process comprises a wet etching process, a dry etching process, or a combination thereof.

4. The manufacturing method of the electronic device according to claim 1, wherein there is an interval between the second sub-opening and the first sub-opening in a first direction and a second direction, the first direction is orthogonal to the second direction, the first direction and the second direction are orthogonal to the top view direction of the substrate, and the interval is greater than or equal to 5 μm.

5. The manufacturing method of the electronic device according to claim 1, further comprising:

forming a bonding pad in the at least one opening.

6. The manufacturing method of the electronic device according to claim 5, wherein the at least one opening exposes a part of the conductive layer, and before the bonding pad is formed in the at least one opening, a surface treatment process is performed on a top surface of the exposed conductive layer.

7. The manufacturing method of the electronic device according to claim 5, further comprising:

providing a chip on the bonding pad, wherein the chip is electrically connected to the conductive layer.

8. The manufacturing method of the electronic device according to claim 1, wherein in forming the circuit structure on the conductive layer, an active component is formed, and the active component is electrically connected to a chip.

* * * * *